United States Patent [19]
Besserer et al.

[11] Patent Number: 6,039,420
[45] Date of Patent: *Mar. 21, 2000

[54] FRAME FOR A SWITCHGEAR CABINET

[75] Inventors: Horst Besserer, Herborn; Marc Hartel, Reiskirchen; Jürgen Zachrai, Dillenburg, all of Germany

[73] Assignee: Rittal-Werk Rudolf Loh GmbH & Co. KG, Herborn, Germany

[*] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/718,548

[22] PCT Filed: Oct. 7, 1995

[86] PCT No.: PCT/EP95/03959

§ 371 Date: Oct. 9, 1996

§ 102(e) Date: Oct. 9, 1996

[87] PCT Pub. No.: WO96/14679

PCT Pub. Date: May 17, 1996

[30] Foreign Application Priority Data

Nov. 5, 1994 [DE] Germany ............................. 44 39 628

[51] Int. Cl.[7] .................................................. A47B 47/00
[52] U.S. Cl. .................................... 312/265.1; 312/265.4; 211/189
[58] Field of Search .............................. 312/265.1, 265.4, 312/265.5, 265.6, 257.1, 263, 140; 211/26, 182, 189, 191; 361/724, 725; 52/653.1, 653.2

[56] References Cited

U.S. PATENT DOCUMENTS

| | | | |
|---|---|---|---|
| 3,265,419 | 8/1966 | Durnbaugh et al. | 312/265.5 X |
| 3,275,394 | 9/1966 | Massinger | 312/265.4 |
| 4,512,591 | 4/1985 | Plante | 211/189 X |
| 4,621,879 | 11/1986 | Schneider | 312/140 X |
| 4,782,637 | 11/1988 | Eriksson et al. | 52/653.1 X |
| 5,046,791 | 9/1991 | Kooiman | 312/265.1 |
| 5,202,818 | 4/1993 | Betsch et al. | 211/189 X |
| 5,312,005 | 5/1994 | Odell | 211/189 |
| 5,333,950 | 8/1994 | Zachnai | 312/265.1 |
| 5,498,073 | 3/1996 | Charbonneau et al. | 312/265.4 X |
| 5,513,759 | 5/1996 | Besserer et al. | 211/189 |
| 5,516,225 | 5/1996 | Kvols | 312/265.1 X |
| 5,749,476 | 5/1998 | Besserer et al. | 211/189 X |
| 5,772,296 | 6/1998 | Hartel et al. | 312/265.2 X |

FOREIGN PATENT DOCUMENTS

| | | |
|---|---|---|
| 0045926 | 8/1981 | European Pat. Off. . |
| 0420676 | 5/1992 | European Pat. Off. . |
| 1601944 | 10/1970 | France . |
| 2207402 | 6/1974 | France . |
| 1591480 | 10/1970 | Germany . |
| 8107658 | 7/1981 | Germany . |
| 3734564 | 4/1989 | Germany . |
| 4017511 | 10/1990 | Germany . |
| 4137836 | 3/1993 | Germany . |
| 9406149 | 7/1994 | Germany . |
| 9419850 | 9/1994 | Germany . |
| 4333027 | 10/1994 | Germany . |

*Primary Examiner*—Peter M. Cuomo
*Assistant Examiner*—James O. Hansen
*Attorney, Agent, or Firm*—Pauley Petersen Kinne & Fejer

[57] ABSTRACT

A frame composed of horizontal and vertical frame members that form front and back frames, the frames being joined at their corners using depth struts. The invention achieves a simple construction by designing the horizontal and vertical frame members as extruded sections with continuous integral or molded-in fastening grooves and screw sockets, by designing the depth struts as angle sections whose sides together form a right angle and by using fastening screws to screw the frame members meeting at the corners to the sides of the depth struts.

17 Claims, 2 Drawing Sheets

FRAME FOR A SWITCHGEAR CABINET

BACKGROUND OF THE INVENTION

This invention relates to a rack made of horizontal and vertical frame legs forming a front and rear frame, wherein the frames are connected with each other by depth struts in corner areas of the frames.

In a plurality of racks the frame legs and the depth struts are made from the same profiled strand or the same hollow profiled section. Additional corner connectors are required for assembling the rack, which are inserted with plug shoulders into plug receivers of the frame legs and depth struts. These corner connectors are specially manufactured elements which considerably increase the outlay for the rack. The frame legs themselves are provided in this case with fasteners for assembly rails, components and the like, which again makes their production more expensive. Often such fastening openings distributed over the entire length of the frame legs are not necessary at all.

SUMMARY OF THE INVENTION

It is one object of this invention to provide a rack of the general type mentioned above, which can be rapidly assembled with a few simple, preferably commercially available elements, without having to do without the application of assembly rails, components or the like on the vertical and horizontal frame legs.

This object is attained in accordance with one preferred embodiment of this invention wherein the horizontal and vertical frame legs of the frames are embodied as extruded profiled sections with fastening grooves and screw sockets formed continuously on or in them. The depth struts are embodied as angled profiled sections with legs at right angles to each other. The frame legs which meet each other at the corners are bolted together with the legs of the depth struts by means of fastening screws.

Only one extruded profiled piece is required for this rack, from which the horizontal and vertical frame legs are cut. These extruded profiled sections have integrally formed screw sockets and fastening grooves. The depth struts are cut from a commercially available angled profile piece and simply bolted together with the horizontal and vertical frame legs. The fastening grooves are preferably undercut, so that the fastening means can be securely received. In this way a fastening capability is provided over the entire length of the frame legs, for example for fastening flanges, slide rails, telescoping rails and the like, so that component supports, housings and the like can be installed in the rack.

If the depth struts are covered at the connecting areas with the frame legs by corner pieces or over their entire length by corner strips having a triangular cross section and by filling the space between the legs of the depth struts, then the rack can be cleanly covered in the area of the depth struts.

The connecting points on the frame legs are preferably positioned in such a way that the screw sockets are disposed inside of the external contour of the frame legs, which are generally rectangular in cross section.

A unique connection secure against rotation between the depth struts and the frame legs results because the frame legs have at least two screw sockets extending parallel at a distance from each other, which receive the fastening screws inserted through bores of the legs of the depth struts.

A flush border can be achieved between the front and the back of the rack because the legs of the depth struts and the corner pieces or corner strips end flush with the adjoining front or rear narrow exterior sides of the frames.

The clean border of the rack toward the outside is enhanced with the legs of the depth struts with the free longitudinal edges terminating flush with the wide exterior sides of the frame legs. The corner pieces or the corner strips preferably have a triangular cross section in this case.

If the depth struts, the corner pieces and/or the corner strips project past the front and/or back of the rack, it is possible to install a door on the front and/or back of the rack.

So that a circumferential closure can be achieved, the depth struts, the corner pieces and/or the corner strips support a shoulder for the insertion of a sealing element in the area of their interior edges, which is set back as far as the front and/or back of the rack.

The installation of component supports, housings and the like into the rack is relatively easier because the fastening grooves are disposed on the wide interior sides facing each other of the frame legs constituting the frames.

BRIEF DESCRIPTION OF THE DRAWINGS

This invention will be described in detail in view of an exemplary embodiment represented in the drawings wherein.

DESCRIPTION OF PREFERRED EMBODIMENTS

Figure 1:
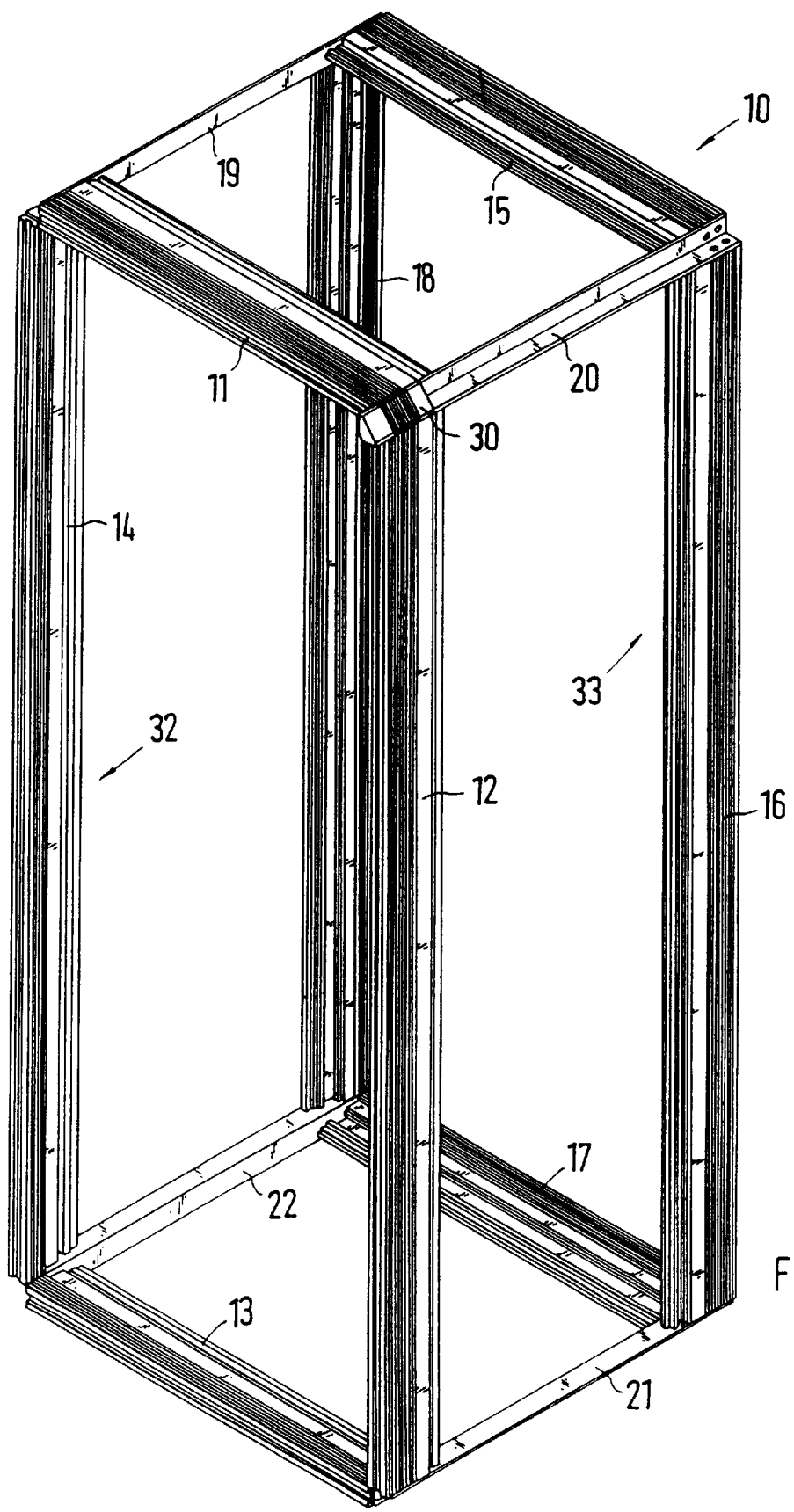
FIG. 1 is an assembled rack in a perspective view.

As FIG. 1 shows, the rack 10 is formed by a front frame 32 and a rear frame 33. The front frame 32 comprises the horizontal frame legs 11 and 13 and the vertical frame legs 12 and 14. The rear frame 33 comprises the horizontal frame legs 15 and 17 and the vertical frame legs 16 and 18. The two frames 32 and 33 are connected with each other in their corner areas by means of four depth struts 19, 20, 21 and 22.

Figure 2:
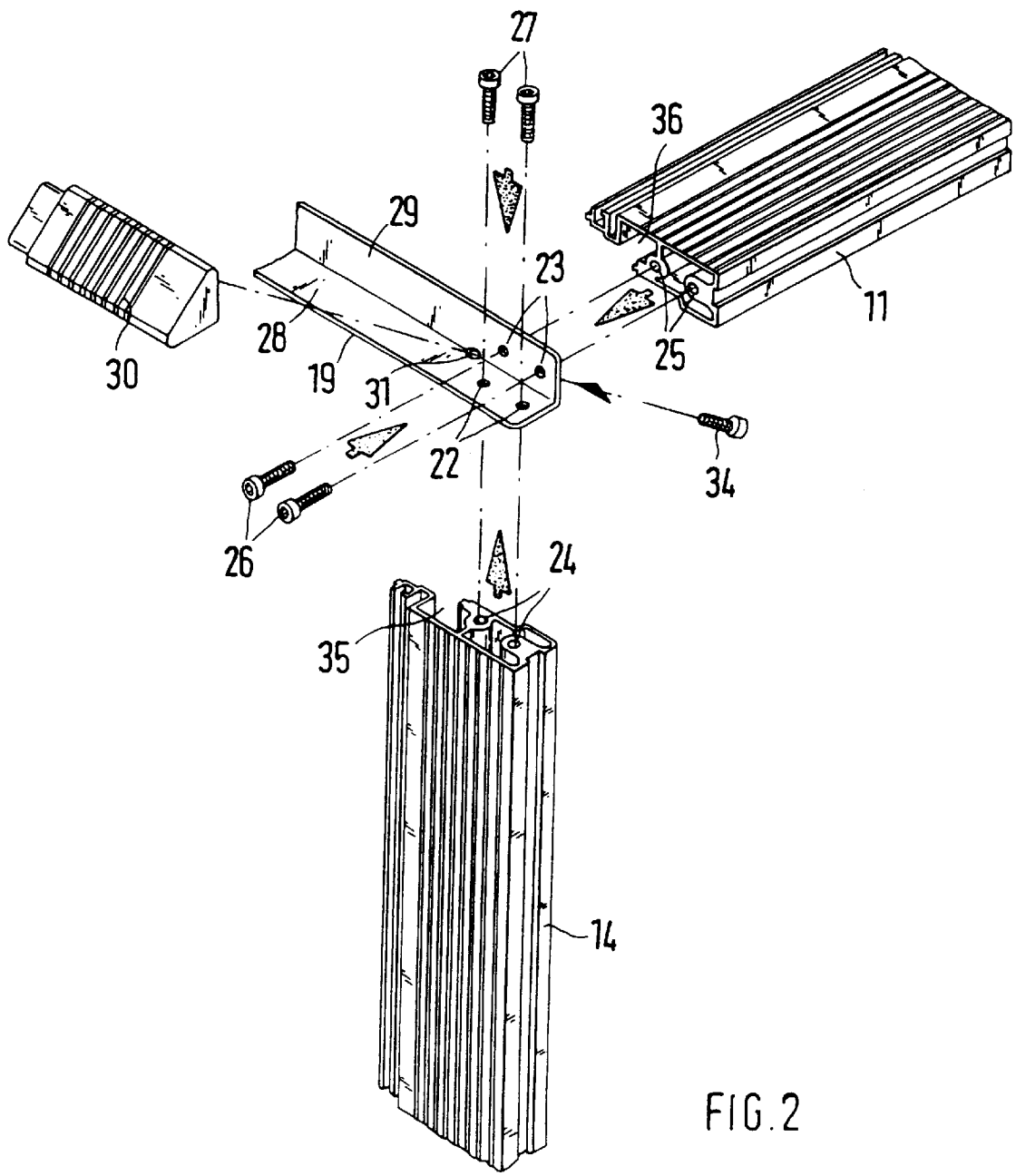
FIG. 2 is a connection of a horizontal and a vertical frame leg with a depth strut in the corner area of the rack, in an exploded view.

The connection in one corner area is shown in FIG. 2. As shown, the frame legs are each formed as an extruded section. A cross section of the frame leg, is essentially rectangular, wherein the narrow sides face the front and back of the rack 10. Two continuous screw sockets are formed at a distance from each other inside the exterior contour of the frame legs 11 to 18, as represented by the screw sockets 24 on the vertical frame leg 14 and the screw sockets 25 on the horizontal frame leg 11. An upper left corner of the rack 10 is shown in FIG. 2. Continuous fastening grooves 35 and 36 are also formed in the frame legs 11 to 18 and are arranged on the wide interior side walls of the front frame 32 and the rear frame 33 facing each other and are preferably undercut in order to receive fastening means, to secure against loss.

The depth struts 19 to 22 are each embodied as sections of a commercially available angled profiled section wherein the two legs 28 and 29 are at right angles with respect to each other. The horizontal and the vertical frame legs 11 and 14 can be screwed to the legs 28 and 29 of the depth strut 19 through the bores 23 by means of the fastening screws 26 and 27, wherein the fastening screws 26 and 27 are screwed into the screw sockets 24 and 25. In this embodiment, the fronts of the legs 28 and 29 end flush with the narrow sides of the frame legs 11 to 18 on the front and back of the rack 10. The free longitudinal edges of the legs 28 and 29 end flush with the wide exteriors of the frame legs 11 to 18.

If the connecting points are to be covered, the connecting area in the corners of the front frame 32 and the rear frame 33 can be covered by means of corner pieces 30 of a triangular cross section, which are attached by means of a screw 34 via the bore 31 of the depth strut 19 into the corner piece 30. These corner pieces 30 fill the space between the legs 28 and 29 of the depth struts 19 to 22. The depth struts 19 to 22 can also be covered over their entire length by means of corner strips of the same cross section in lieu of the corner pieces 30.

If it is intended to attach a door to the front and/or back, the depth struts 19 to 22, the corner pieces 30 and/or the corner strips project away from the front and/or back of the front frame 32 and/or the rear frame 33 and form hinge or locking connections. In this case the interior corner of the depth struts 19 to 22, of the corner pieces 30 and/or of the corner strips is set off and forms, together with the front of the front frame 32 and/or the back of the rear frame 33, continuous support shoulders for a sealing element in the area of the front and or back of the front frame 32 and/or the rear frame 33 with the narrow sides of the front frame 32 and the rear frame 33.

What is claimed is:

1. In a rack having horizontal frame legs and vertical frame legs forming a front frame and a rear frame, wherein the frames are connected with each other by depth struts in corner areas of the frames, the improvement comprising:

the horizontal frame legs (11–14) and the vertical frame legs (15–18) of the front frame (32) and the rear frame (33) each formed as an extruded profiled section with a continuous fastening groove (35, 36) and two continuous screw sockets (24, 25);

the depth struts (19, 20, 21, 22) formed as L-shaped profiled sections with two plate-shaped legs (28, 29), each of the depth struts (19, 20, 21, 22) extending entirely between the front frame (32) and the rear frame; and the frame legs (11, 12; 12, 13; 13, 14 or 15, 16; 16, 17; 17, 18; 18, 15) meeting each other at the corner areas bolted together with the plate-shaped legs (28, 29) of the depth struts (19 to 22) by fastening screws (26, 27); and a plurality of corresponding corner pieces (30) covering the depth struts (19 to 22) at the corner areas, and each of the corner pieces (30) having a triangular cross section and filling a space between the plate-shaped legs (28, 29) of the depth struts (19 to 22).

2. In a rack in accordance with claim 1, wherein the screw sockets (24, 25) are positioned inside of an exterior surface of the frame legs (11 to 18) which are generally rectangular in cross section.

3. In a rack in accordance with claim 1, wherein at least one of the depth struts (19 to 22), the corner pieces (30) and the corner strips project past at least one of the front and the back of the rack (10).

4. In a rack in accordance with claim 3, wherein at least one of the depth struts (19 to 22), the corner pieces (30) and the corner strips supports a shoulder for accommodating insertion of a sealing element in an area of interior edges which is set back as far as at least one of the front and the back of the rack (10).

5. In a rack having horizontal frame legs and vertical frame legs forming a front frame and a rear frame, wherein the frames are connected with each other by depth struts in corner areas of the frames, the improvement comprising:

the horizontal frame legs (11–14) and the vertical frame legs (15–18) of the front frame (32) and the rear frame (33) each formed as an extruded profiled section with a continuous fastening groove (35, 36) and two continuous screw sockets (24, 25);

the depth struts (19, 20, 21, 22) formed as L-shaped profiled sections with two plate-shaped legs (28, 29), each of the depth struts (19, 20, 21, 22) extending entirely between the front frame (32) and the rear frame; and the frame legs (11, 12; 12, 13; 13, 14 or 15, 16; 16, 17; 17, 18; 18, 15) meeting each other at the corner areas bolted together with the plate-shaped legs (28, 29) of the depth struts (19 to 22) by fastening screws (26, 27); and the plate-shaped legs (28, 29) of the depth struts (19 to 22) and one of a plurality of corner pieces (30) and a plurality of corner strips ending flush with a plurality of adjoining narrow exterior sides of the front frame (32) and the rear frame (33).

6. In a rack in accordance with claim 5, wherein the screw sockets (24, 25) are positioned inside of an exterior surface of the frame legs (11 to 18) which are generally rectangular in cross section.

7. In a rack in accordance with claim 6, wherein the two screw sockets (24 or 25) extend parallel at a distance from each other and receive the fastening screws (26, 27) inserted through bores (23) of the plate-shaped legs (28, 29) of the depth struts (19 to 22).

8. In a rack in accordance with claim 7, wherein the plate-shaped legs (28, 29) of the depth struts (19 to 22) and one of the corner pieces (30) and the corner strips end flush with a plurality of adjoining narrow exterior sides of the front frame (32) and the rear frame (33).

9. In a rack in accordance with claim 8, wherein the plate-shaped legs (28, 29) of the depth struts (19 to 22) with free longitudinal edges end flush with wide exterior sides of the frame legs (11 to 18).

10. In a rack in accordance with claim 9, wherein one of the corner pieces (30) and the corner strips have a triangular cross section.

11. In a rack in accordance with claim 10, wherein at least one of the depth struts (19 to 22), the corner pieces (30) and the corner strips project past at least one of the front and the back of the rack (10).

12. In a rack in accordance with claim 11, wherein at least one of the depth struts (19 to 22), the corner pieces (30) and the corner strips supports a shoulder for accommodating insertion of a sealing element in an area of interior edges which is set back as far as at least one of the front and the back of the rack (10).

13. In a rack in accordance with claim 12, wherein the fastening grooves (35, 36) are positioned on the wide interior sides facing each other of the frame legs (11 to 14 or 15 to 18).

14. In a rack in accordance with claim 5, wherein the two screw sockets (24 or 25) extend parallel at a distance from each other and receive fastening screws (26, 27) inserted through bores (23) of the plate-shaped legs (28, 29) of the depth struts (19 to 22).

15. In a rack in accordance with claim 5, wherein the plate-shaped legs (28, 29) of the depth struts (19 to 22) with free longitudinal edges end flush with wide exterior sides of the frame legs (11 to 18).

16. In a rack in accordance with claim 5, wherein one of a plurality of corner pieces (30) and a plurality of corner strips have a triangular cross section.

17. In a rack in accordance with claim 5, wherein the fastening grooves (35, 36) are positioned on a plurality of wide interior sides facing each other of the frame legs (11 to 14 or 15 to 18).

* * * * *